(12) United States Patent
Flatters et al.

(10) Patent No.: US 10,290,915 B2
(45) Date of Patent: May 14, 2019

(54) WAVEGUIDE LAUNCH COMPRISING A FIRST SUBSTRATE HAVING AN INTERNAL WAVEGUIDE COUPLED BY A DEFORMABLE WAVEGUIDE TO A SECOND SUBSTRATE HAVING A BACKSHORT THEREIN

(71) Applicant: Filtronic Broadband Limited, Sedgefield (GB)

(72) Inventors: Gary Flatters, Sedgefield (GB); Richard Smith, Richmond (GB)

(73) Assignee: Filtronic Broadband Limited, Sedgefield (GB)

( * ) Notice: Subject to any disclaimer, the term of this patent is extended or adjusted under 35 U.S.C. 154(b) by 0 days.

(21) Appl. No.: 15/487,191

(22) Filed: Apr. 13, 2017

(65) Prior Publication Data

US 2017/0301975 A1     Oct. 19, 2017

(30) Foreign Application Priority Data

Apr. 14, 2016    (GB) ................................. 1606529.4

(51) Int. Cl.
*H01P 5/107*     (2006.01)
*H01B 1/12*     (2006.01)
(Continued)

(52) U.S. Cl.
CPC ............ *H01P 5/107* (2013.01); *H01B 1/124* (2013.01); *H01P 3/121* (2013.01); *H01P 11/002* (2013.01); *H05K 1/115* (2013.01)

(58) Field of Classification Search
CPC ............................... H01P 5/107; H01P 11/002
(Continued)

(56) References Cited

U.S. PATENT DOCUMENTS

2002/0196097 A1* 12/2002 Okude .................... H01P 5/107
                                                                                                        333/26
2004/0041651 A1* 3/2004 Shono ..................... H01P 5/107
                                                                                                        333/26
(Continued)

FOREIGN PATENT DOCUMENTS

WO       02/082579 A1    10/2002
WO    2011/109939 A1    9/2011

OTHER PUBLICATIONS

GB Search Report, Application No. GB1606529.4, Date of Search: Aug. 25, 2017.

*Primary Examiner* — Benny T Lee
(74) *Attorney, Agent, or Firm* — Howard & Howard Attorneys PLLC

(57) ABSTRACT

A waveguide launch includes a
first substrate having
    a first electrically insulating layer having first and second faces,
    an internal waveguide extending through the first electrically insulating layer,
    the internal waveguide being defined by an electrically conductive internal waveguide side wall, and,
    first and second electrically conductive layers in electrical contact with the internal waveguide side wall, and
an electrically conductive probe launch. The waveguide launch also includes;
a second substrate having
    a second electrically insulating layer having third and fourth faces,
    a backshort recess arranged within the second electrically insulating layer,
    a third electrically conductive layer on the third face, and, (Continued)

an interconnection waveguide extending between the first and third faces.

18 Claims, 5 Drawing Sheets

(51) Int. Cl.
    *H01P 3/12*     (2006.01)
    *H01P 11/00*     (2006.01)
    *H05K 1/11*     (2006.01)

(58) Field of Classification Search
    USPC .......................................................... 333/26
    See application file for complete search history.

(56) References Cited

U.S. PATENT DOCUMENTS

| | | | | |
|---|---|---|---|---|
| 2007/0182505 A1* | 8/2007 | Fujita et al. | ............ | H01P 5/107 |
| | | | | 333/26 |
| 2011/0057741 A1* | 3/2011 | Dayan et al. | ............ | H01P 5/107 |
| | | | | 333/26 |
| 2012/0256707 A1* | 10/2012 | Leiba et al. | ............ | H01P 3/003 |
| | | | | 333/208 |
| 2016/0118705 A1* | 4/2016 | Tang et al. | ............ | H01P 11/003 |
| | | | | 333/26 |

\* cited by examiner

WAVEGUIDE LAUNCH COMPRISING A FIRST SUBSTRATE HAVING AN INTERNAL WAVEGUIDE COUPLED BY A DEFORMABLE WAVEGUIDE TO A SECOND SUBSTRATE HAVING A BACKSHORT THEREIN

CROSS-REFERENCE TO RELATED APPLICATIONS

The present application claims the benefit of pending GB Patent Application Serial No. 1606529.4, filed Apr. 14, 2016, the entire disclosure of which is hereby expressly incorporated by reference.

BACKGROUND OF THE INVENTION

The present invention relates to a waveguide launch. More particularly, but not exclusively, the present invention relates to a waveguide launch comprising first and second substrates and an interconnection waveguide extending between the two substrates, the wall defining the interconnection waveguide being an electrically conductive polymer. The present invention also relates to a method of manufacture of a waveguide launch. More particularly, but not exclusively, the present invention relates to a method of manufacture of a waveguide launch comprising providing first and second substrates, arranging a first end of an interconnection waveguide on one of the substrates then urging the two substrates together so that the other end of the interconnection waveguide is urged into contact with the other substrate.

SUMMARY OF THE INVENTION

Waveguide launches are known. A waveguide launch receives a microwave or mm wave signal along a waveguide and transfers it to an electrically conductive signal line, typically a microstrip. A waveguide launch can also work in reverse, transferring a mm or microwave signal on a signal line to a waveguide.

Waveguide launches are common in mm and microwave circuits. They often find application in, for example, connecting the output of an amplifier to a diplexer or an antenna.

A large number of different designs of waveguide launch are known of which U.S. Pat. No. 8,912,859 (Siklu Communication ltd) is a typical example. As shown in this example known waveguides tend to be complex multilayer structures. Such structures are complex and expensive to manufacture.

The present invention seeks to overcome the problems of the prior art.

Accordingly, in a first aspect, the present invention provides a waveguide launch including A first substrate including
  a first electrically insulating layer having first and second faces,
  an internal waveguide extending through the first electrically insulating layer from the first face to the second face, the internal waveguide being defined by an electrically conductive internal waveguide side wall; and,
  first and second electrically conductive layers on the first and second faces respectively each being in electrical contact with the internal waveguide side wall, each electrically conductive layer having an aperture extending therethrough defining first and second mouths of the internal waveguide respectively;
an electrically conductive probe launch extending over the first mouth of the internal waveguide;
a second substrate including
  a second electrically insulating layer having third and fourth faces,
  a backshort recess arranged within the second electrically insulating layer, the backshort recess being defined by an electrically conductive recess wall, the recess wall including a backshort layer defining the base of the recess and a recess side wall extending from the backshort layer to the third face; and,
  a third electrically conductive layer on the third face and in electrical contact with the recess side wall, the third electrically conductive layer having an aperture extending therethrough defining the mouth of the recess; and,
an interconnection waveguide extending between the first and third electrically conductive layers, a first end of the interconnection waveguide extending at least partly around the first mouth of the internal waveguide and a second end of the interconnection waveguide extending at least partly around the recess mouth, the wall defining the interconnection waveguide being an electrically conductive polymer.

The waveguide launch according to the invention can be made as two separate parts which are then connected together by a polymer interconnection waveguide. Each of the two parts are relatively straightforward to manufacture. This considerably simplifies manufacture and reduces the cost associated with manufacture. Further, the waveguide is relatively flexible and so not as fragile as known waveguide launches.

Preferably at least one of the side wall of the internal waveguide and the side wall of the recess comprises a plurality of spaced apart vias extending from one face of its insulating layer to the other.

Preferably the via walls are coated with an electrically conductive coating.

Alternatively the vias are filled with an electrically conductive material.

Preferably the electrically conductive polymer is an isotropically conductive polymer.

Preferably the wall of the interconnection waveguide has a slot therein, the probe launch extending through the slot.

Preferably the probe launch is arranged on the first face of the electrically insulating layer.

Preferably the waveguide launch further includes an external waveguide connected to the second mouth of the internal waveguide.

Preferably the waveguide launch further includes an electrical signal source connected to the probe launch, the signal source being adapted to provide a microwave or mm wave signal.

Preferably the distance between the probe launch and the backshort layer is between 20% and 30% of the wavelength of the signal from the signal source, more preferably between 22% to 27%, more preferably 25%

Preferably the second electrically insulating layer includes first and second electrically insulating sub layers having an electrically conductive layer sandwiched therebetween, a portion of the electrically conductive layer including the backshort layer.

In a further aspect of the invention there is provided a method of manufacture of a waveguide launch including the steps of
(a) providing a first substrate, the first substrate including
a first electrically insulating layer having first and second faces,
an internal waveguide extending through the first electrically insulating layer from the first face to the second face, the internal waveguide being defined by an electrically conductive internal waveguide side wall; and,
first and second electrically conductive layers on the first and second faces respectively each being in electrical contact with the internal waveguide side wall, each electrically conductive layer having an aperture extending therethrough defining first and second mouths of the internal waveguide respectively;
(b) providing a second substrate, the second substrate including
a second electrically insulating layer having third and fourth faces,
a backshort recess arranged within the second electrically insulating layer, the backshort recess being defined by an electrically conductive recess wall, the recess wall including a backshort layer defining the base of the recess and a recess side wall extending from the backshort layer to the third face; and,
a third electrically conductive layer on the third face and in electrical contact with the recess side wall, the third electrically conductive layer having an aperture extending therethrough defining the mouth of the recess;
(c) arranging a first end of an interconnection waveguide around either the recess mouth or the first mouth of the internal waveguide; and,
(d) urging the first and second substrates together such that the other end of the interconnection waveguide is urged into contact around the other of the recess mouth and the first mouth of the internal waveguide,
the wall defining the interconnection waveguide being an electrically conductive polymer.

Preferably the polymer is cured either before or after the step of urging the substrates together.

Preferably the step of urging the first and second substrates together compresses the interconnection waveguide along its length.

Preferably the step of urging the first and second substrates together compresses the interconnection waveguide by at least 5% of its length, more preferably by between 10% and 50% of its length, more preferably by between 20% and 30% of its length.

BRIEF DESCRIPTION OF THE DRAWINGS

The present invention will now be described by way of example only and not in any limitative sense with reference to the accompanying drawings in which.

DETAILED DESCRIPTION OF THE PREFERRED EMBODIMENT(S)

Figure 1A:
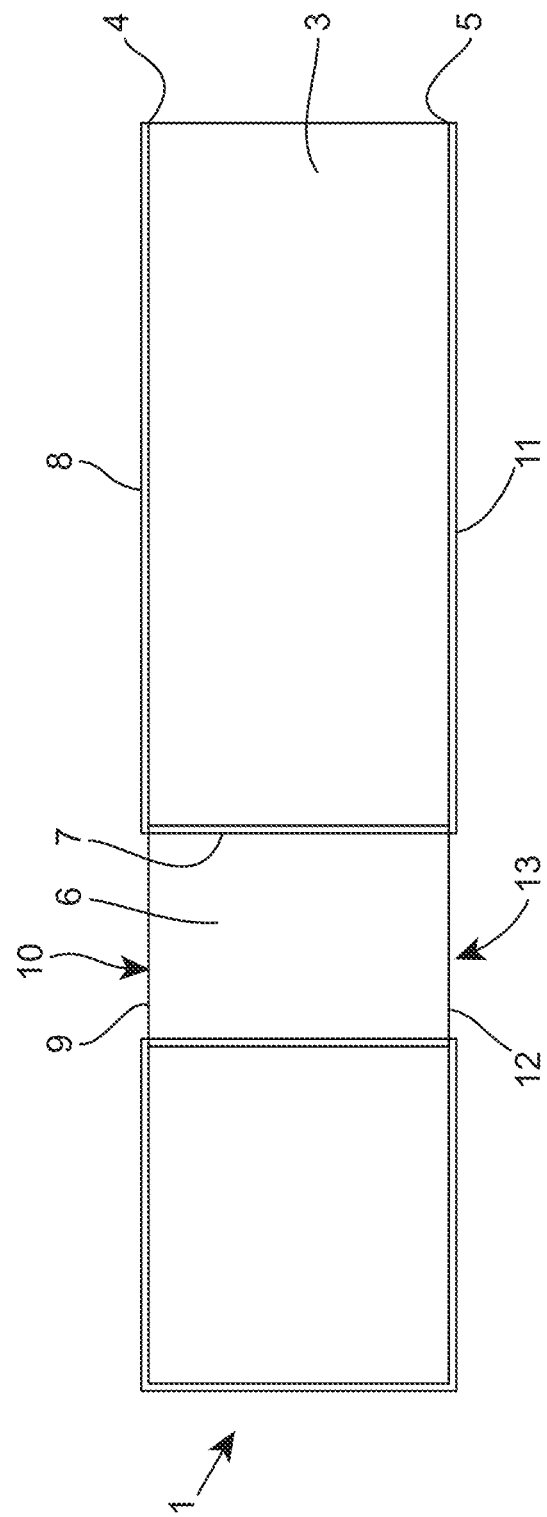
FIG. 1(a) shows a first substrate of a waveguide launch according to the invention in cross sectional view.

Shown in FIG. 1(a) is a first substrate 1 of a waveguide launch 2 (see FIG. 3) according to the invention in cross sectional view. The first substrate 1 comprises a first electrically insulating layer 3, for example a plastics material or glass epoxy. The first electrically insulating layer 3 has first and second spaced apart parallel faces 4, 5.

Extending through the first insulating layer 3 from the first face 4 to the second face 5 is an internal waveguide 6 defined by an electrically conductive internal waveguide side wall 7. As is known in the art the side wall 7 does not need to be a continuous metal film. In this embodiment the side wall 7 includes a plurality of parallel vias extending from the first face 4 to the second face 5. The side wall of each the vias is coated with an electrically conductive film. Provided the vias are spaced sufficiently close together compared to the wavelength of the signal passing along the waveguide 6 the vias act as a continuous electrically conductive wall. Forming the side wall of the internal waveguide 6 from a series of vias rather than a continuous metal film is preferred as it is simpler to manufacture.

In an alternative embodiment of the invention (not shown) each of the vias is filled with an electrically conductive material.

Arranged on the first face 4 of the first electrically insulating layer 3 is a first electrically conductive layer 8. The first electrically conductive layer 8 extends over and is in electrical contact with the internal waveguide side wall 7 as shown. An aperture 9 extends through the first electrically conductive layer 8 and defines a first mouth 10 of the internal waveguide 6.

Arranged on the second face 5 of the first electrically insulating layer 3 is a second electrically conductive layer 11. As with the first electrically conductive layer 8 this extends over and is in electrical contact with the internal waveguide side wall 7 as shown. An aperture 12 extends through the second electrically conductive layer 11 and defines a second mouth 13 of the internal waveguide 6.

Figure 1B:
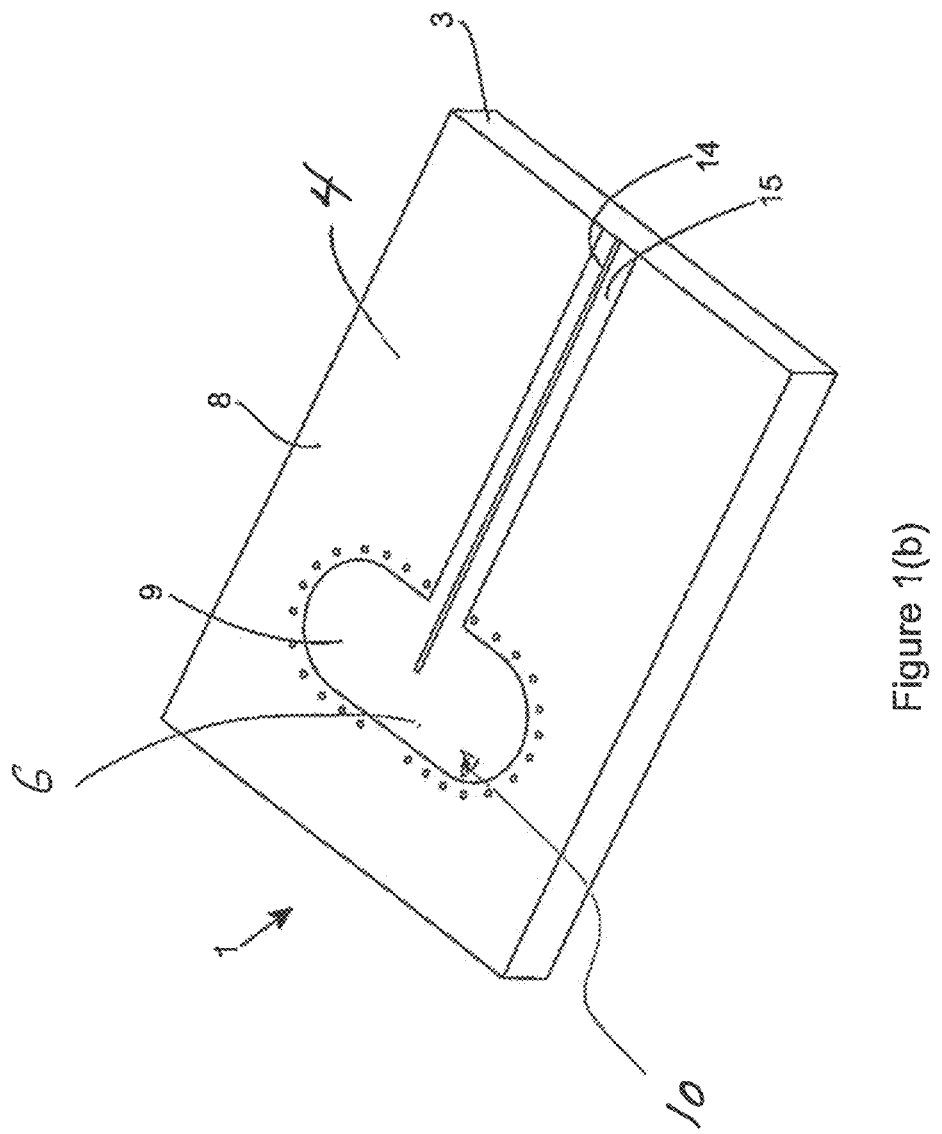
FIG. 1(b) shows the first substrate of FIG. 1(a) in perspective view.

FIG. 1(b) shows the first substrate 1 of FIG. 1(a) in perspective view. This figure shows the first electrically insulating layer 3 and the aperture 9 extending through the first electrically conductive layer 8 defining the first mouth 10 of the internal waveguide 6. Also shown are the vias which form the internal waveguide side wall 7 of FIG. 1(a). The dimensions of the aperture 9, and hence the mouth 10, are substantially the same as the cross sectional dimensions of the internal waveguide 6. In practice the electrically conductive film or filling of the vias extends continuously into the first and second electrically conductive layers 8, 11 as shown in FIG. 1(a).

Also arranged on the first face 4 is an electrically conductive probe launch 14. The probe launch 14 extends over the first mouth 10 of the internal waveguide 6 as shown. Electrical signals at mm or microwave frequencies which pass along the probe launch 14 are radiated by the probe launch 14 along the internal waveguide 6. Similarly, electrical signals which pass at microwave or mm wave frequencies along the internal waveguide 6 are received by the probe launch 14. The probe launch 14 is essentially an antenna.

As can be seen in FIG. 1(b) the probe launch 14 extends away from the first mouth 10 of the internal waveguide 6 along the first face 4 in a gap 15 in the first electrically conductive layer 8. This portion of the probe launch 14, along with the edges of the first electrically conductive layer 8 on either side of it, together form a microstrip.

Figure 2A:
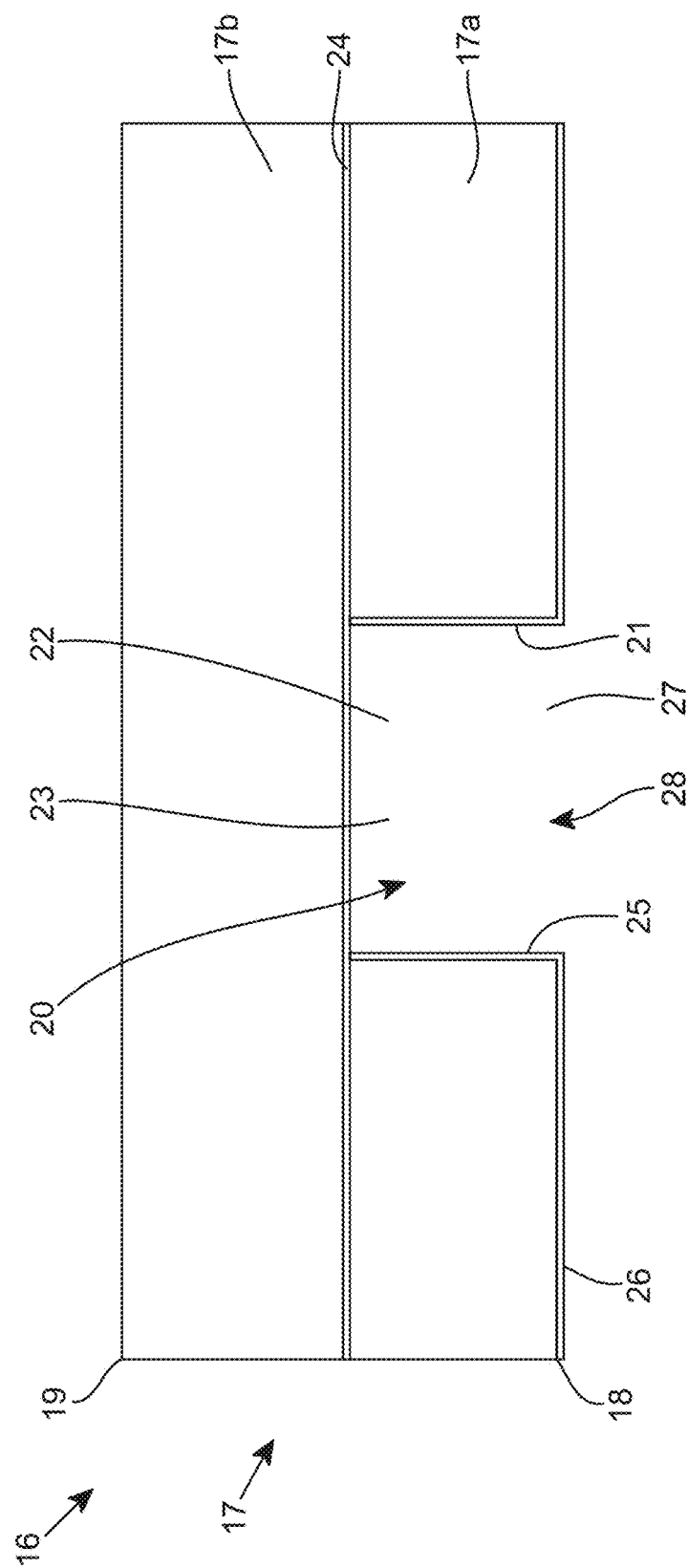
FIG. 2(a) shows a second substrate of a waveguide launch according to the invention in cross sectional view.
Figure 2B:
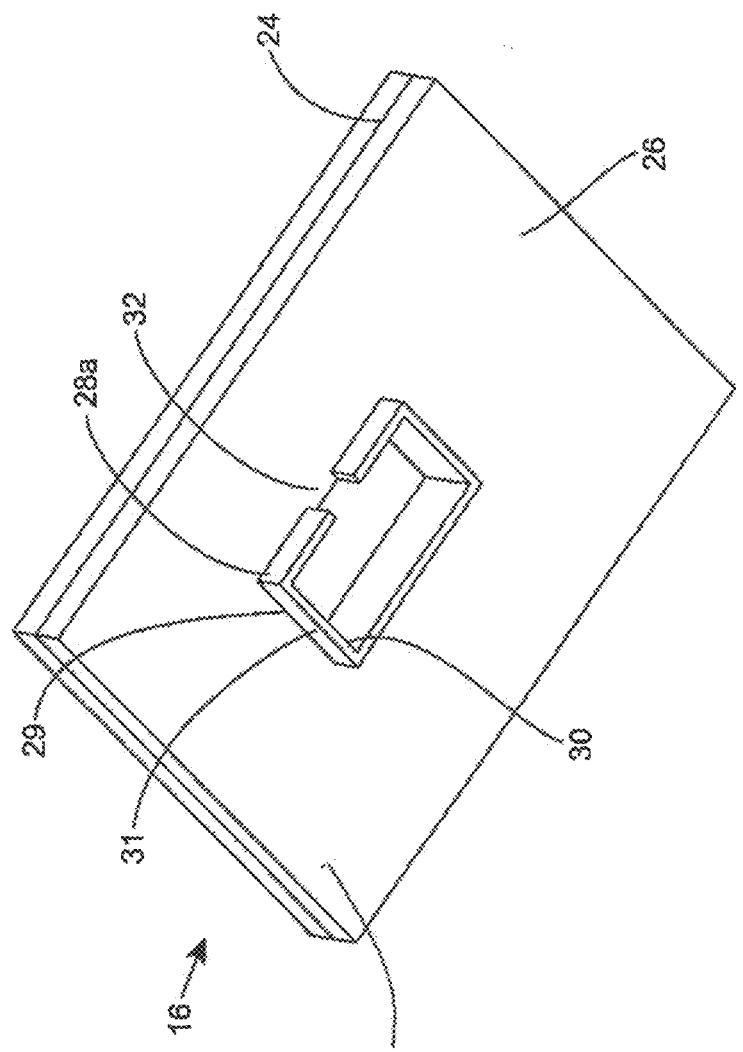
FIG. 2(b) shows the second substrate of FIG. 2(a) in perspective view.

Shown in FIG. 2(*a*) is a second substrate 16 of a waveguide launch 2 (see FIG. 3) according to the invention in vertical cross section. The second substrate 16 includes a second electrically insulating layer 17. The second electrically insulating layer 17 includes third and fourth spaced apart faces 18, 19. A backshort recess 20 is arranged within the second electrically insulating layer 17. The backshort recess 20 is defined by an electrically conductive recess wall 21. The recess wall 21 includes a backshort layer 22 which defines the base 23 of the recess 20. The backshort layer 22 is a portion of an electrically conductive layer 24 which divides the second electrically insulating layer 17 into first and second sub layers 17*a*, 17*b*. The recess wall 21 further includes a recess side wall 25 extending from the backshort layer 22 to the third face 18. In this embodiment the recess side wall 25 is a continuous metal film and the backshort recess 20 is air filled. In an alternative embodiment (not shown) the recess side wall 25 includes a plurality of closely spaced vias either coated with an electrically conductive film on their internal walls or filled with an electrically conductive material. In this alternative embodiment the backshort recess 20 is filled with the material of the second electrically insulating layer 17.

Arranged on the third face 18 of the second electrically insulating layer 17 is a third electrically conductive layer 26. The third electrically conductive layer 26 covers and is in electrical contact with the recess side wall 25. In practice the third electrically conductive layer 26 and recess side wall 25 are portions of the same electrically conductive layer formed by coating the third face 18 of the second electrically insulating layer 17 with an electrically conductive material, typically a metal. An aperture 27 extends through the third electrically conductive layer 18 and defines the mouth 28 of the backshort recess 20. The dimensions of the recess mouth 28 of the backshort recess 20 are the same as the dimensions of the first mouth 10 of the internal waveguide 6.

FIG. 2(*b*) shows the second substrate 16 of FIG. 2(*a*) from below showing the third face 18 and the third electrically conductive layer 26 thereon. FIG. 2(*b*) also shows the electrically conductive layer 24 and an interconnection waveguide 28*a*. The interconnection waveguide 28*a* comprises a first end 29 and a second end 30 and an interconnection waveguide side wall 31 extending therebetween. The first end 29 of the interconnection waveguide 28*a* extends partially around the recess mouth 28. The interconnection waveguide side wall 31 includes a narrow slot 32 as shown.

The interconnection waveguide side wall 31 is an electrically conductive polymer. In this embodiment the electrically conductive polymer is an isotropically conductive polymer. The polymer is plastically deformable. In an alternative embodiment the polymer is elastically deformable.

Figure 3:
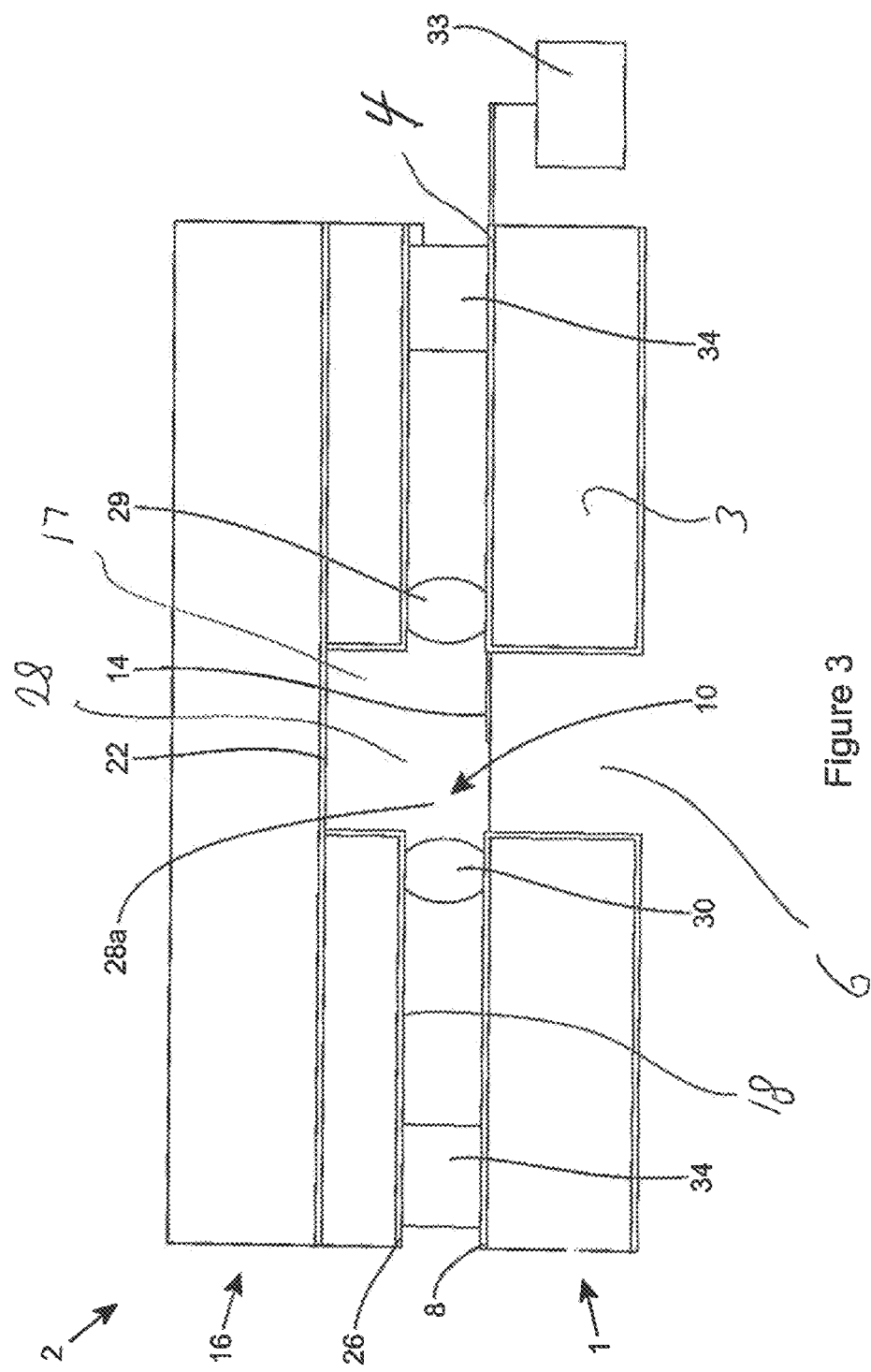
FIG. 3 shows the waveguide launch according to the invention in an assembled state in vertical cross section.

FIG. 3 shows the waveguide launch 2 according to the invention in vertical cross section in the assembled state. In the assembled state the second end 30 of the interconnection waveguide 28*a* extends partly around the first mouth 10 of the internal waveguide 6. The probe launch 14 extends from outside the interconnection waveguide 28*a*, through the slot and over the first mouth 10 of the internal waveguide 6 as shown. The first electrically conductive layer 8 is also shown.

Connected to the probe launch 14 is an electrical signal source 33. The electrical signal source 33 provides an electrical signal in the microwave or mm wave frequency range to the probe launch 14. The first and second substrates 1, 16 are held slightly apart by spacers 34. The spacers 34 ensure that the distance between the probe launch 14 and the backshort layer 22 is 0.25 times the wavelength of the signal generated by the signal source. More generally, the spacers 34 ensure the distance between the probe launch 14 and the backshort layer 22 is in the range 20% to 30% of the wavelength of the signal generated by the signal source 33, more preferably between 22% and 27%.

In an alternative embodiment of the invention the probe launch 14 is connected to a receiver adapted to receive a signal in the microwave to mm wave range. Again, the spacers 34 ensure the correct spacing between the probe launch 14 and backshort layer 22, only this time with respect to the received signal rather than the transmitted signal.

In order to manufacture the waveguide launch 2, the first and second substrates 1, 16 are provided with a probe launch 14 on the first face 4 and extending over the first mouth 10 of the internal waveguide 6. The first end 29 of the interconnection waveguide 28*a* is then arranged around the recess mouth 28. The interconnection waveguide 28*a* could be printed onto the third electrically conductive layer 26 around the recess mouth 28. Alternatively, since the material of the interconnection waveguide 28*a* is a plastically deformable material the material could be squeezed from a tube around the recess mouth 28.

In a next step the first substrate 1 is arranged parallel to the second substrate 16 with the first face 4 of the first insulating layer 3 parallel to the third face 18 of the second insulating layer 17. The two substrates 1, 16 are then urged together until the other end 30 of the interconnection waveguide 28*a* comes into contact with the first electrically conductive layer 8 around the first mouth 10 of the internal waveguide 6. The two substrates 1, 16 are then further urged together longitudinally compressing the interconnection waveguide 28*a* along its length and so firmly urging the two ends of the interconnection waveguide 28*a* into contact with the first and second substrates 1, 16.

Preferably spacers 34 are arranged between the first and second substrates 1, 16 before they are urged together. The substrates 1, 16 are urged together until they abut the spacer blocks 34, so controlling the final separation between the first and second substrates 1, 16 (and hence the distance between the probe launch 14 and backshort layer 22) as described above.

Typically during manufacture the interconnection waveguide 28*a* is compressed by at least 5% of its length, more preferably by between 10% and 50% of its length, more preferably by between 20% and 30% of its length. With this degree of compression the two ends of the interconnection waveguide 28*a* are urged firmly into contact with the two substrates 1, 16. However, the material of the interconnection waveguide 28*a* still retains some plasticity and so the interconnection waveguide 28*a* will act as a shock absorber between the two substrates 1, 16. This makes the waveguide launch according to the invention much less susceptible to impacts than known waveguide launches.

Preferably the material of the interconnection waveguide 28*a* is cured once the waveguide launch 2 is assembled. In an alternative embodiment of the invention the material of the interconnection waveguide 28*a* is cured before the first and second substrates 1, 16 are urged together.

In a further alternative embodiment of a method according to the invention the interconnection waveguide 28*a* is attached around the first waveguide mouth 10 and then around the recess mouth 28 when the first and second substrates 1, 16 are urged together.

The waveguide launch 2 according to the invention is suitable for use at microwave and mm wave frequencies. Microwave frequencies are typically in the range 3 to 30 GHz. MM wave frequencies are typically in the range 30 to 300 GHz.

The invention claimed is:
1. A waveguide launch comprising
   a first substrate comprising
      a first electrically insulating layer having first and second faces,
      an internal waveguide extending through the first electrically insulating layer from the first face to the second face, the internal waveguide being defined by an electrically conductive internal waveguide side wall; and,
      first and second electrically conductive layers on the first and second faces respectively, each electrically conductive layer being in electrical contact with the internal waveguide side wall, each electrically conductive layer having a respective aperture extending therethrough defining first and second mouths of the internal waveguide respectively;
   an electrically conductive probe launch extending over the first mouth of the internal waveguide;
   a second substrate comprising
      a second electrically insulating layer having third and fourth faces,
      a backshort recess arranged within the second electrically insulating layer, the backshort recess being defined by an electrically conductive recess wall, the recess wall comprising a backshort layer defining a base of the recess and a recess side wall extending from the backshort layer to the third face; and,
      a third electrically conductive layer on the third face and in electrical contact with the recess side wall, the third electrically conductive layer having an aperture extending therethrough defining a mouth of the recess; and,
   an interconnection waveguide extending between the first and third electrically conducting layers, a first end of the interconnection waveguide extending at least partly around the first mouth of the internal waveguide and a second end of the interconnection waveguide extending at least partly around the mouth of the recess, the interconnection waveguide defining a wall that is a plastically or elastically deformable electrically conductive polymer.
2. A waveguide launch as claimed in claim 1, wherein at least one of the electrically conductive internal waveguide side wall of the internal waveguide and the recess side wall of the recess respectively comprises a plurality of spaced apart vias extending through the corresponding one of the first and second insulating layers.
3. A waveguide launch as claimed in claim 2, wherein walls of the vias are coated with an electrically conductive coating.
4. A waveguide launch as claimed in claim 2, wherein the vias are filled with an electrically conductive material.
5. A waveguide launch as claimed in claim 1, wherein the deformable electrically conductive polymer is an isotropically conductive polymer.
6. A waveguide launch as claimed in claim 1, wherein the wall of the interconnection waveguide has a slot therein, the probe launch extending through the slot.
7. A waveguide launch as claimed in claim 1, wherein the probe launch is arranged on the first face of the first electrically insulating layer.
8. A waveguide launch as claimed in claim 1, wherein the second electrically insulating layer comprises first and second electrically insulating sub layers having an electrically conductive layer sandwiched therebetween, a portion of the electrically conductive layer comprising the backshort layer.
9. A waveguide launch as claimed in claim 1, further comprising an electrical signal source connected to the probe launch, the signal source being adapted to provide a microwave or mm wave signal.
10. A waveguide launch as claimed in claim 9, wherein the distance between the probe launch and the backshort layer is between 20% and 30% of the wavelength of the signal from the signal source.
11. A waveguide launch as claimed in claim 9, wherein the distance between the probe launch and the backshort layer is 25%.
12. A waveguide launch as claimed in claim 9, wherein the distance between the probe launch and the backshort layer is between 22% to 27%.
13. A method of manufacture of a waveguide launch comprising the steps of
   (a) providing a first substrate, the first substrate comprising
      a first electrically insulating layer having first and second faces,
      an internal waveguide extending through the first electrically insulating layer from the first face to the second face, the internal waveguide being defined by an electrically conductive internal waveguide side wall; and,
      first and second electrically conductive layers on the first and second faces respectively, each electrically conductive layer being in electrical contact with the internal waveguide side wall, each electrically conductive layer having a respective aperture extending therethrough defining first and second mouths of the internal waveguide respectively;
   (b) providing a second substrate, the second substrate comprising
      a second electrically insulating layer having third and fourth faces,
      a backshort recess arranged within the second electrically insulating layer, the backshort recess being defined by an electrically conductive recess wall, the recess wall comprising a backshort layer defining a base of the recess and a recess side wall extending from the backshort layer to the third face; and,
      a third electrically conductive layer on the third face and in electrical contact with the recess side wall, the third electrically conductive layer having an aperture extending therethrough defining a mouth of the recess;
   (c) arranging a first end of an interconnection waveguide around either the mouth of the recess or the first mouth of the internal waveguide; and,
   (d) urging the first and second substrates together such that the other end of the interconnection waveguide is urged into contact around the other of the mouth of the recess and the first mouth of the internal waveguide, the interconnection waveguide defining a wall that is a plastically or elastically deformable electrically conductive polymer.
14. A method of manufacture of a waveguide launch as claimed in claim 13 wherein the step of urging the first and second substrates together compresses the interconnection waveguide along the length thereof.

15. A method of manufacture of a waveguide launch as claimed in claim 14, wherein the step of urging the first and second substrates together compresses the interconnection waveguide by at least 5% of the length thereof.

16. A method of manufacture of a waveguide launch as claimed in claim 14, wherein the step of urging the first and second substrates together compresses the interconnection waveguide by between 5% and 30% of the length thereof.

17. A method of manufacture of a waveguide launch as claimed in claim 14, wherein the step of urging the first and second substrates together compresses the interconnection waveguide by between 5% and 10% of the length thereof.

18. A method of manufacture of a waveguide launch as claimed in claim 13, wherein the polymer is cured either before or after the step of urging the substrates together.

* * * * *